Figure 1:
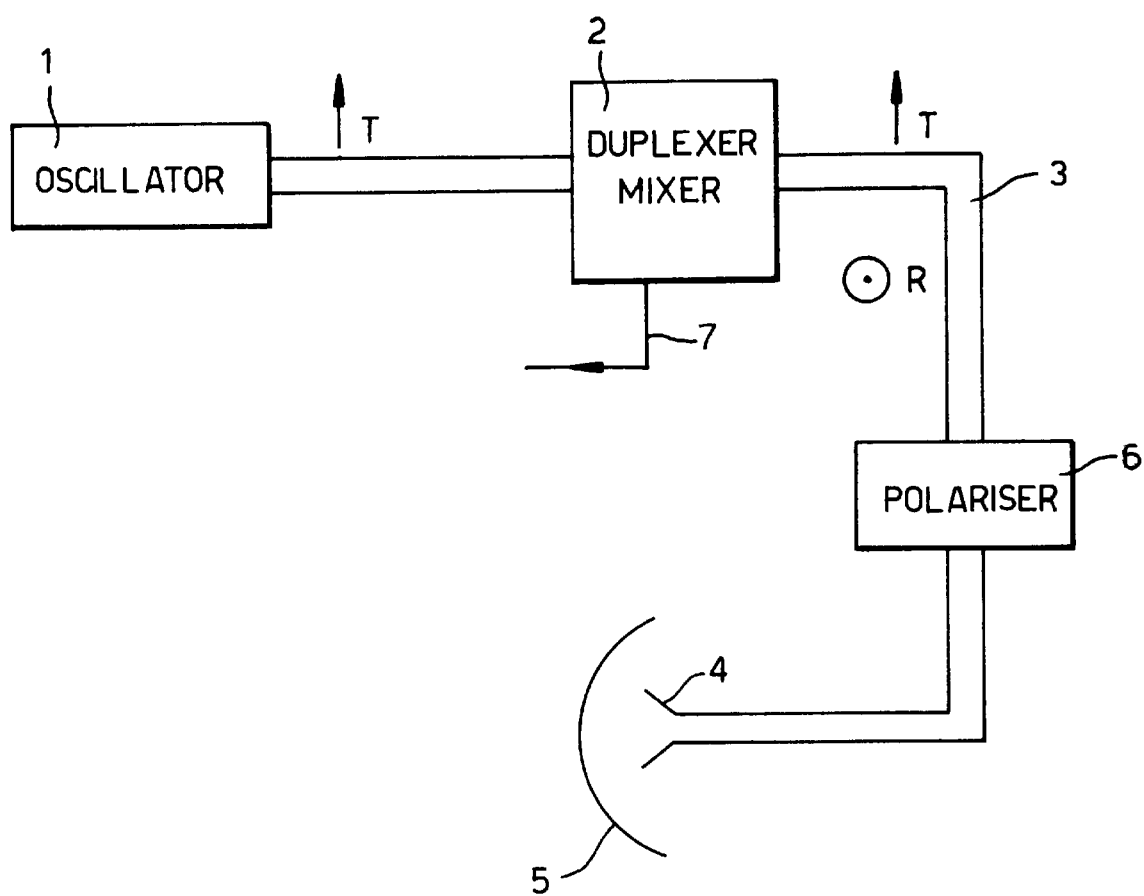

United States Patent
Ephgrave et al.

[11] Patent Number: 5,926,129
[45] Date of Patent: Jul. 20, 1999

[54] TRANSCEIVERS

[75] Inventors: Barry Ephgrave; David Skidmore; John Anderson, all of Stevenage; Stanley W Waterman, Hitchin, all of United Kingdom

[73] Assignee: Matra BAe Dynamics (UK) Limited, Hertfordshire, United Kingdom

[21] Appl. No.: 08/976,009

[22] Filed: Nov. 21, 1997

[30] Foreign Application Priority Data

Nov. 23, 1996 [GB] United Kingdom .................. 9624478

[51] Int. Cl.$^6$ .............................. G01S 13/00; H01P 3/08
[52] U.S. Cl. ......................................................... 342/200
[58] Field of Search .................................. 342/128, 200; 455/80, 81, 328; 333/204; 343/700 MS

[56] References Cited

U.S. PATENT DOCUMENTS

| | | | |
|---|---|---|---|
| 4,122,449 | 10/1978 | Endo | 342/104 |
| 4,731,611 | 3/1988 | Müller et al. | 342/28 |
| 4,777,654 | 10/1988 | Conti | 455/80 |
| 4,991,228 | 2/1991 | Ohta et al. | 455/328 |
| 5,315,303 | 5/1994 | Tsou et al. | 342/200 |

FOREIGN PATENT DOCUMENTS

| | | |
|---|---|---|
| 2 220 525 | 1/1990 | United Kingdom . |
| 2 227 141 | 7/1990 | United Kingdom . |

*Primary Examiner*—Daniel T. Pihulic
*Attorney, Agent, or Firm*—Nixon & Vanderhye P.C.

[57] ABSTRACT

A combined duplexer/mixer (2) for use with FMCW radar systems has a waveguide section (12,13) containing a fin-line structure (17,18) for responding to the linearly polarized radar return signal while permitting passage of the orthogonally polarized transmitted signal (T). A portion of the transmitted signal is extracted by a patch antenna (22), this extracted signal forming a local oscillator signal for mixing with the return.

6 Claims, 3 Drawing Sheets

TRANSCEIVERS

BACKGROUND OF THE INVENTION

1. Field of the Invention

This invention relates to transceivers and particularly, though not exclusively to FMCW radar transceivers operable in the millimeter waveband.

2. Discussion of Prior Art

A radar system generally requires a means for separating the transmitted signal from the received signal.

This can be achieved by using separate transmit and receive antennas. However, space limitations often make this option undesirable.

An alternative option is to employ a duplexer, which is a device that allows a single antenna to be used for both the transmitter and receiver.

A CW system requires the transmitter to be active simultaneously with the receiver, so the duplexer must separate and isolate the transmitted power from the receive port of the radar. Known ways of achieving this include the use of a hybrid junction, a circulator or a polarizer to split the signals.

FMCW systems also require a local oscillator (LO) signal for demodulating the received signal. One method of generating the LO signal relies on tapping off a portion of the transmitted signal.

See for example EP-A-185,446, which discloses a duplexer in which a portion of the transmitted signal is tapped off by means of a field-distorting probe.

The use of a probe does have certain disadvantages however; manufacture is difficult and the disturbance it causes to the transmitted signal can impair the overall performance of the transceiver.

SUMMARY OF THE INVENTION

It is an object of this invention to mitigate the above disadvantages.

Accordingly, the present invention consists of a combined duplexer and mixer comprising a waveguide section, a circuit structure, within said section for receiving first electro-magnetic radiation (R) polarized in a first direction of polarization and passing through the section in one direction of travel while being relatively unresponsive to second electro-magnetic radiation (T) polarized orthogonally to said first direction and passing through the section opposite to said first direction of travel, coupling means within the section, for causing a fraction of said second electro-magnetic radiation (T) to be tapped off, diode means within the section for causing said first electro-magnetic radiation (R) and said tapped off fraction of the second electromagnetic radiation to become mixed and to produce an IF signal, characterised in that the coupling means comprises a patch antenna.

BRIEF DESCRIPTION OF THE INVENTION

Figure 3:
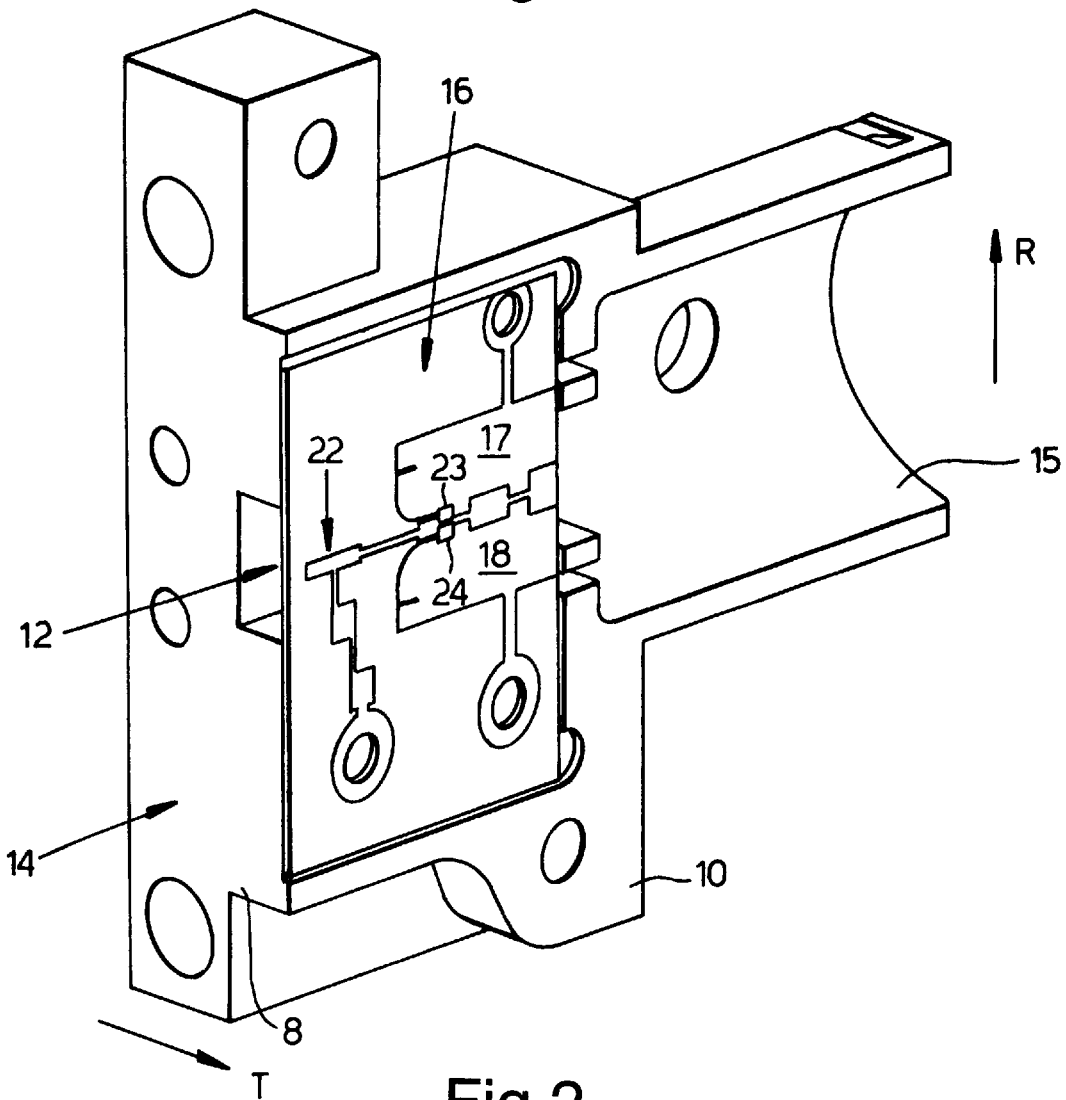
Figure 2:
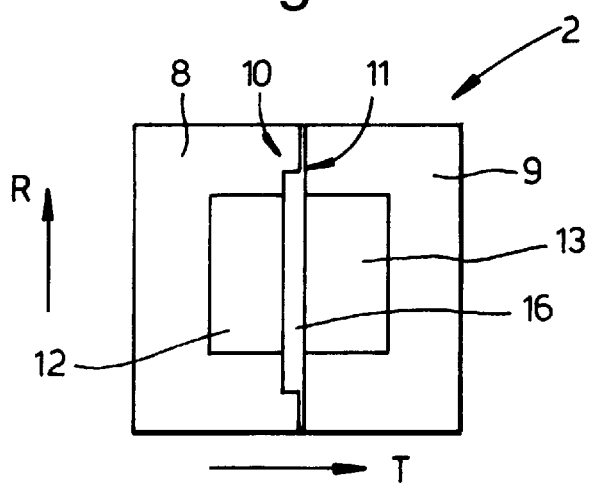
Figure 4:
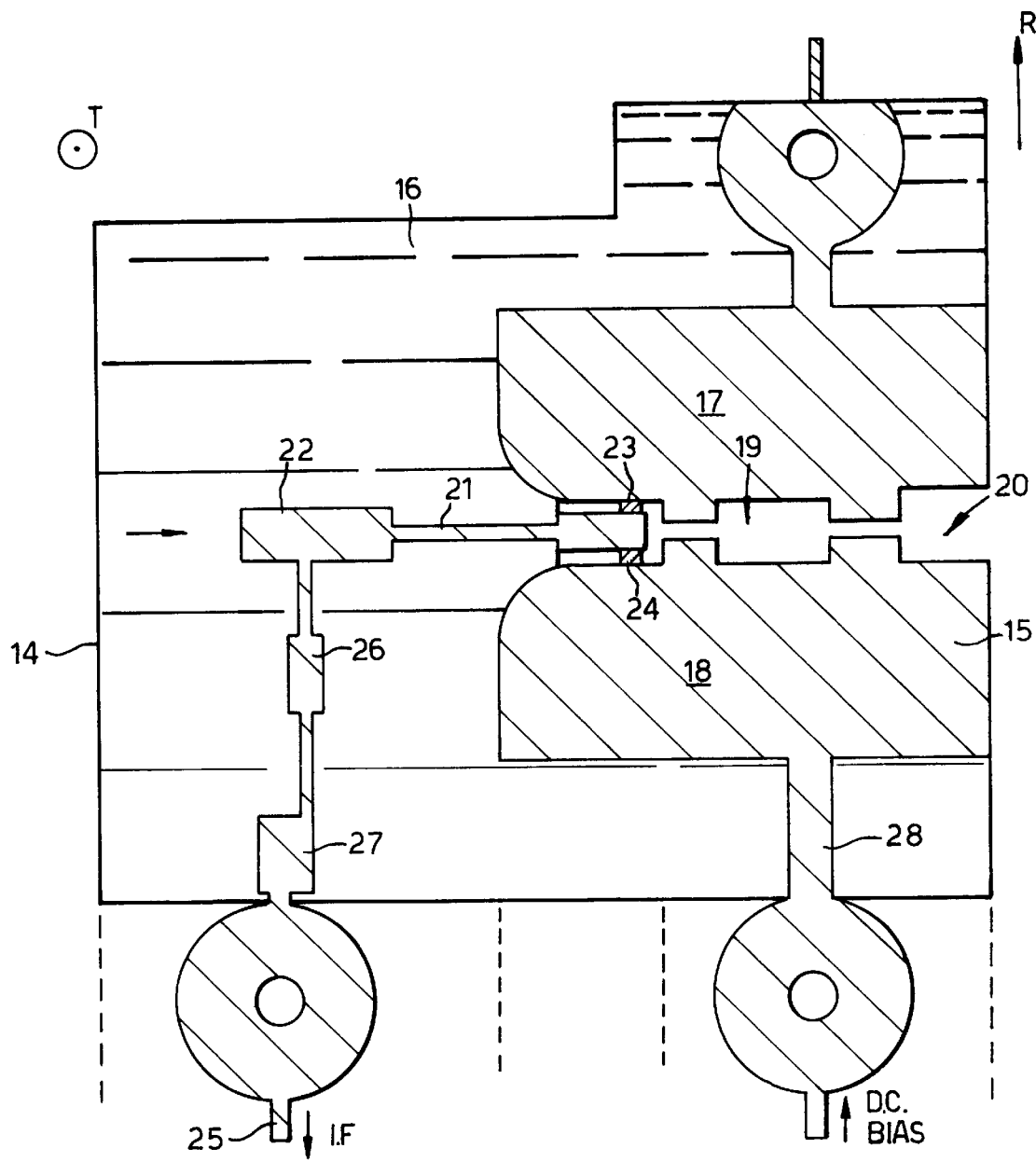

An embodiment of the invention will now be described, by way of example only, with reference to the drawings of which, FIG. 1 is a block diagram of a transceiver, FIG. 2 is an end view of a combined duplexer and mixer in accordance with the invention, FIG. 3 is a sectional, perspective view of the combined duplexer and mixer in accordance with the invention and FIG. 4 is a plan view of the circuit elements comprising the invention.

DETAILED DISCUSSION OF PREFERRED EMBODIMENTS

The transceiver of FIG. 1 comprises a transmitter drive oscillator 1 of which the output, linearly polarized in direction T is fed via a duplexer/mixer 2, waveguide 3 and an antenna feed 4 to a reflector dish 5 from whence the signal is radiated. The radiated signal is given a circular polarization by any suitable circular polarizing means 6 which may be of a kind well known in the art. Alternatively, the antenna dish 5 could be provided with a polarizing ridge or grating structure (not shown) or a radome (not shown), which in some applications would be provided in front of dish 5, may incorporate a suitable grating structure so that the transmitted signal becomes circularly polarised after it has left the dish is while it is passing through the radome. These alternative techniques are also known in the art.

As is further known, the radar return signal will also be circularly polarized but in a direction or 'hand' opposite to that of the transmitted signal. Thus, on passing through the polarizer 6 (or the alternative polarizing means), the return signal will become linearly polarized in direction R orthogonal to the polarization direction T of the signal sent out from duplexer/mixer 2. Within the duplexer/mixer 2, the return signal is mixed, by a balanced mixing process, with a local oscillator signal which is formed by tapping off a portion of the T signal from oscillator 1, so as to form an IF (intermediate frequency) output signal 7. Thus, the device 2 combines the functions of a duplexer (for permitting passage of the T signal from oscillator 1 to waveguide 3 while directing the R signal from waveguide 3 to an auxiliary port), a tapping device (for tapping off a portion of the signal from oscillator 1) and a balanced mixer for forming the IF signal.

As shown in FIGS. 2 and 3, the duplexer/mixer 2 comprises two rectangular metal bocks 8 and 9 which are normally secured together by any suitable fixing means (not shown). The mating faces 10 and 11 of the blocks 8 and 9 have respective rectangular recesses 12 and 13 formed therein so that, when the blocks are fixed together, the recesses form a square waveguide extending through the assembly. The transmission signal from the oscillator 1, polarized in direction t, is coupled in to this waveguide at the end 14 of the assembly while, at the end 15 of the assembly, it is coupled to the waveguide 3 of FIG. 1. A shallow rectangular recess is formed in the face 10 of block 8 extending each side of recess 12. Into this recess, there is fitted a sheet of dielectric material 16 such that, when the blocks are assembled together, sheet 16 extends across the waveguide formed by recesses 12 and 13 in the direction orthogonal to direction T. On one surface of this sheet 16, (see FIG. 3) there is provided a metallisation pattern shown in greater detail in FIG. 4.

This pattern includes two portions 17 and 18 which define a fin-line structure. The two portions 17 and 18 are recessed to define a diode-matching transfer 19 (towards the end 14) and a waveguide-to fin-line transformer 20 (close to end 15).

An elongate metallisation strip 21 is also provided and extends between the portions 17 and 18 from a region close to the diode matching transformer 19 and end 14. Connected to the strip 21 at end 14, there is a patch antenna 22. At a point between the fin-line metallisation portions 17 and 18, the strip 21 is coupled to the portions 17 and 18 each side of it by way of two diodes 23 and 24. Also the patch antenna 22 is connected to a microstrip IF output line 25 formed by a suitable metallisation pattern on the surface of sheet 16 including filter elements 26 and 27 and extending out to the side of the block 8 where it is connected to a suitable IF output connector (not shown).

Portion 18 is connected to a microstrip input line 28 which feeds the diodes 23, 24 with a DC bias from a remote source (not shown).

On the reverse side of the sheet 16 is a ground plane (not shown).

Owing to the orientation of the fin-line structure (17,18), the T signal from the oscillator 1 of FIG. 1 passes through the waveguide defined by the recesses 12 and 13 substantially unmodified (the presence of the fin-line structure acting only to form, in effect a bifurcated waveguide) except that a small portion of it will become tapped off by the patch antenna 22. Meanwhile the return signal entering the duplexer/mixer waveguide at end 15 and polarized in the orthogonal direction R becomes coupled in to the fin-line structure and mixed by the diodes 23 and 24 with the portion of the outgoing signal tapped off by the patch antenna 22 to form the designed IF signal which is then extracted via line 25.

The percentage of power picked off by the patch antenna 22 can be adjusted depending on the geometry of the patch 22.

If the power picked off by the patch antenna 22 is high enough, then the bias current to the mixer diodes 23, 24 can be dispensed with.

Using this arrangement, a duplexer/mixer with low transmission power loss and very high transmission isolation to the mixer RF port can be realised.

Further, as no additional components or ferrites are required, the cost can be kept low.

A further advantage of using a patch antenna rather than an upstanding probe for example is that the patch is a single printed item which forms part of the duplexer/miser circuit and requires no additional component and is therefore easier to manufacture and hence cheaper.

Further to this, the patch antenna presents less disturbance to the transmitted orthogonal signal than a probe and hence provides a better match to the transmitter.

We claim:

1. A combined duplexer and mixer comprising:
   a waveguide section,
   a circuit structure within said section for receiving first electro-magnetic radiation (R) polarized in a first direction of polarization and passing through the section in one direction of travel while being relatively unresponsive to second electro-magnetic radiation (T) polarized orthogonally to said first direction and passing through the section opposite to said first direction of travel,
   a patch antenna within the section causing a fraction of said second electro-magnetic radiation (T) to be tapped off, and
   at least one diode within the section for causing said first electro-magnetic radiation (R) and said tapped off fraction of the second electro-magnetic radiation to become mixed and to produce an IF signal.

2. A combined duplexer and mixer according to claim 1 in which the circuit structure is configured as a fin-line structure.

3. A combined duplexer and mixer according to claim 2 in which the circuit structure further includes a diode matching transformer and a waveguide-to-finline transformer.

4. A combined duplexer and mixer according to claim 1 in which the patch antenna is coupled to the at least one diode by a metallised strip.

5. A combined duplexer and mixer according to claim 1 in which the patch antenna is connected to a microstrip IF output line via filter elements.

6. A combined duplexer and mixer according to claim 1 in which the circuit structure incorporates means for supplying a bias current to the at least one diode.

* * * * *